United States Patent
Kang et al.

(10) Patent No.: US 6,294,424 B1
(45) Date of Patent: Sep. 25, 2001

(54) METHOD FOR FABRICATING A SEMICONDUCTOR DEVICE

(75) Inventors: Won Jun Kang; Yoon Nam Kim; Hyun Gu Yoon, all of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/412,644

(22) Filed: Oct. 5, 1999

(30) Foreign Application Priority Data

Oct. 28, 1998 (KR) ................................................ 98-45587

(51) Int. Cl.⁷ ................................................ H01L 21/8242
(52) U.S. Cl. ..................... 438/243; 438/152; 438/164; 438/241; 438/430
(58) Field of Search .................................... 438/241, 243, 438/430, 152, 164, FOR 212, FOR 200

(56) References Cited

U.S. PATENT DOCUMENTS

| | | | |
|---|---|---|---|
| 4,864,374 | 9/1989 | Banerjee | ............................. 357/23.6 |
| 5,122,476 | * 6/1992 | Fazan et al. | |
| 5,372,966 | * 12/1994 | Kohyama | |
| 5,380,674 | * 1/1995 | Kimura et al. | |
| 5,492,851 | * 2/1996 | Ryou | |
| 5,744,386 | 4/1998 | Kenney | ............................... 438/245 |
| 5,913,118 | * 6/1999 | Wu | |
| 5,981,332 | * 11/1999 | Mandelman et al. | |
| 6,001,683 | * 12/1999 | Lee | |

FOREIGN PATENT DOCUMENTS

| | | | |
|---|---|---|---|
| 6-104398 | * 4/1994 | (JP) | |
| 6-120446 | * 4/1994 | (JP) | |

* cited by examiner

Primary Examiner—George Fourson
Assistant Examiner—Michelle Estrada
(74) Attorney, Agent, or Firm—Nath & Associates PLLC; Gary M. Nath; Marvin C. Berkowitz

(57) ABSTRACT

The method involves forming a N well over a cell part and a P well over a periphery part of the semiconductor substrate, etching the N well and the P well to form trenches for a storage electrode and an element isolating film, forming an insulating film over the resulting structure, thereby filling the trench on the periphery part, sequentially forming a dielectric layer pattern and a storage electrode on the trench of the cell part, forming a storage electrode, forming an intermediate layer over the resulting structure, exposing the storage electrode, forming an undoped polysilicon layer over the resulting structure, thereby connecting the undoped polysilicon layer with the storage electrode, forming a polysilicon layer pattern and an intermediate insulating pattern, and forming a MOS transistor and a bit line over the polysilicon layer pattern of the cell part and the periphery part. This method is capable of decreasing the number of process and the step coverage between a cell part and a periphery part of a semiconductor substrate, thereby improving the characteristic and reliance of the semiconductor device.

15 Claims, 6 Drawing Sheets

METHOD FOR FABRICATING A SEMICONDUCTOR DEVICE

TECHNICAL FIELD OF THE INVENTION

The present invention relates to a method for fabricating a semiconductor device, and more particularly a method for fabricating a semiconductor device that is capable of increasing a capacitance and decreasing a step coverage between a cell part and a periphery part by simultaneously forming a capacitor over the cell part while an element isolating process is carried out by a trench on a periphery part.

BACKGROUND OF THE INVENTION

The recent high integration trend of semiconductor devices inevitably involves a reduction in cell dimension. However, such a reduction in cell dimension causes difficulty in forming capacitors of sufficient capacitance. This is due to the capacitance being proportional to the surface area of the capacitor.

In case of a dynamic random access memory (DRAM) device constituted by one metal oxide semiconductor (MOS) transistor and one capacitor, word lines and bit lines is perpendicularly disposed on the semiconductor substrate in the vertical and horizontal directions.

In addition, a capacitor is formed to be laid across the two gates and a contact hole is formed on the middle of the capacitor. In case of a capacitor, a polysilicon film is used as a conductive film and an oxide film, and a nitride film or an ONO (oxide-nitride-oxide) are used as an dielectric film.

On the other hand, it is important to reduce the area occupied by the capacitor and still obtain a high capacitance of the capacitor for the high integration of the DRAM device.

The capacitance C of the capacitor can be expressed by the following equation:

$$C=(E_o*E_r*A)/T$$

Where, Eo represents the dielectric constant in vacuum, Er represents the dielectric constant of the dielectric film, A represents the area of the capacitor, and T represents the thickness of the dielectric film.

From the equation, the capacitance C can be increased by forming the dielectric film using a dielectric material exhibiting a high dielectric constant Er. In addition, the capacitance C can be increased by reducing the thickness of a dielectric film or increasing a surface area of the capacitor.

Among these methods, the dielectric material having a high dielectric constant, for example Ta2O5, TiO2 or SrTiO3, has been studied.

Reliability such as junction breakdown voltage of these materials and characteristic of the thin film is not certain, thereby being difficult to apply in a practical device.

In addition, the reduction of the thickness of the dielectric film is destructed during drive the device so that it gives a serious problem in the reliability of the capacitor.

Furthermore, the following methods are used to increase the surface area of the storage electrode of a capacitor.

The method in which a polysilicon film is formed to a stacked structure of multiple layers so that these are passed through and then connected to each other, and form a pin structure is used or the method of forming a storage electrode of a cylindrical type on the contact is used.

With regard to increasing the surface area of the storage electrode of a capacitor, an example of a conventional method for fabricating a semiconductor device is illustrated in FIG. 1.

FIG. 1 is a sectional view showing a conventional method for fabricating a semiconductor device.

In accordance with this conventional method, an element isolating film (not shown) and a gate insulating film 13 are sequentially formed over a semiconductor substrate 11, then a structure stacked a mask insulating film pattern 17 is formed over a gate electrode 15.

Impurities of low density are implanted into the semiconductor substrate 11 under the sides of the stacked structure, thereby forming a LDD region (lightly doped drain).

Thereafter, a first insulating spacer 21 is formed over a side wall of the stacked structure and then, impurities of high density are implanted into the semiconductor substrate 11 in the sides of the first insulating spacer 21, this process forms source/drain regions 23 so that a MOS transistor is formed.

A bit line (not shown) is formed so that it is connected to the source/drain electrode 23 and then, a planarizing film 25 is formed over the resulting structure.

Then, a photoresist film pattern (not shown) exposing the portion predetermined to be a storage electrode is formed over the planarizing film 25.

Thereafter, the planalizing film 25 is selectively etched by the photoresist film pattern as an etching mask, thereby forming a contact hole for a storage electrode and then, the photoresist film pattern is removed.

A second insulating spacer 27 is formed on the side wall of the contact hole, thereby preventing the generation of bridges between the devices.

Then, a conductive film (not shown) for a first storage electrode is formed, thereby connecting to the source/drain electrode 23 through the contact hole, then a core insulating film (not shown) is formed over the conductive film for the first storage electrode.

The core insulating film and the conductive film for the first storage electrode are selectively etched by a storage electrode mask as an etching mask.

Thereafter, a conductive film (not shown) for a second storage electrode is formed over the resulting structure and then the conductive film is etched by a blanket etching process, thereby forming a storage electrode 29 for a cylindrical type.

The core insulating film is removed and then, a dielectric film 31 and a plate electrode 33 are sequentially formed over the resulting structure.

The storage electrode is formed into a cylindrical type of a three dimensional structure to increase the surface area of a capacitor. While the capacitor is only formed over the cell part of the semiconductor substrate but the capacitor is not formed over the periphery part of the semiconductor substrate.

However, the conventional method for fabricating a semiconductor device has various problems.

In the case of the conventional method, the capacitor having a storage electrode of a three dimensional structure of a cylindrical type is only formed over the cell part of the semiconductor substrate so that a step coverage between the cell part and the periphery part is increased.

Accordingly, in the following process for forming a metal line, a part of the photoresist film pattern is washed away on the boundary region between the cell part and periphery part, thereby generating a notching phenomenon. In addition, in serious case, a short between lines is generated, thereby reducing a operational characteristic of the semiconductor device and being difficult to achieve the planarization.

Therefore, it is problematic that a process yield and a reliability of device operation is reduced.

SUMMARY OF THE INVENTION

One of the objects of the invention is to provide a method for fabricating a semiconductor device, capable of decreasing the number of process for fabricating a semiconductor device, by simultaneously forming a capacitor over the cell part while an element isolating process is carried out by a trench on a periphery part.

Another object of the invention is to provide a method for fabricating a semiconductor device, capable of decreasing a step coverage between a cell part and a periphery part of a semiconductor substrate, thereby improving the characteristic and reliance of the semiconductor device.

In accordance with one aspect of the present invention, the method for fabricating a semiconductor device comprises the steps of forming a N well over a cell part and a P well over a periphery part of a semiconductor substrate, respectively; etching a portion will be predetermined a storage electrode and a portion will be predetermined an element isolating region in the semiconductor substrate, thereby forming trenches in the N well and P well; forming an isolating film over resulting structure, thereby filling the trenches; removing the insulating film on the N well; sequentially forming a dielectric layer and a conductive film over the resulting structure; selectively removing the dielectric layer and the conductive film on the P well, thereby forming a dielectric layer pattern and a storage electrode and simultaneously forming an element isolating film in the trench of P well; forming an intermediate insulating layer exposing the storage electrode over the resulting structure; forming an undoped polysilicon layer over the resulting structure, thereby connecting with the storage electrode; selectively removing the intermediate layer and the undoped polysilicon layer, thereby forming an intermediate layer pattern and an undoped polysilicon layer pattern on the N well in the cell part; and forming a MOS transistor and a bit line over the udoped polysilicon layer pattern of the cell part and P well of the periphery part.

In accordance with another aspect of the present invention, the method for fabricating a semiconductor device comprises the steps of providing a semiconductor substrate including a cell part and a periphery part; forming a first conductive type well over the cell part of the semiconductor substrate and a second conductive type well over the periphery part of the semiconductor substrate; etching a predetermined portion will be a storage electrode and a predetermined portion will be an element isolating region in the semiconductor substrate to form trenches; forming an insulating film over the resulting structure, thereby filling the trenches in the cell part and the periphery part; removing the insulating film in the trench of the first conductive well; sequentially forming a dielectric layer and a conductive layer over the resulting structure; forming a first photoresist film pattern for a storage electrode mask over said conductive layer on the cell part; selectively removing the conductive layer and the dielectric layer using the first photoresist film pattern as a mask to form a storage electrode and a dielectric layer pattern and simultaneously forming an element isolating film in the trench of the periphery part; removing the first photoresist film pattern and forming an intermediate insulating layer with a contact hole exposing the storage electrode over the resulting structure; forming an undoped polysilicon layer over the resulting structure, thereby connecting with the storage electrode through the contact hole; forming a second photoresist film pattern over a predetermined portion will be an active region of the undoped polysilicon layer; removing the undoped polysilicon layer and the intermediate insulating layer by the second photoresist film pattern as a mask to form a polysilicon layer pattern and an intermediate insulating layer pattern; removing the second photoresist film pattern; and forming a MOS transistor and a bit line over the polysilicon layer pattern of the cell part and the periphery part.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 2 to 10, a method for fabricating a semiconductor device in accordance with the present invention is illustrated.

Figure 1:
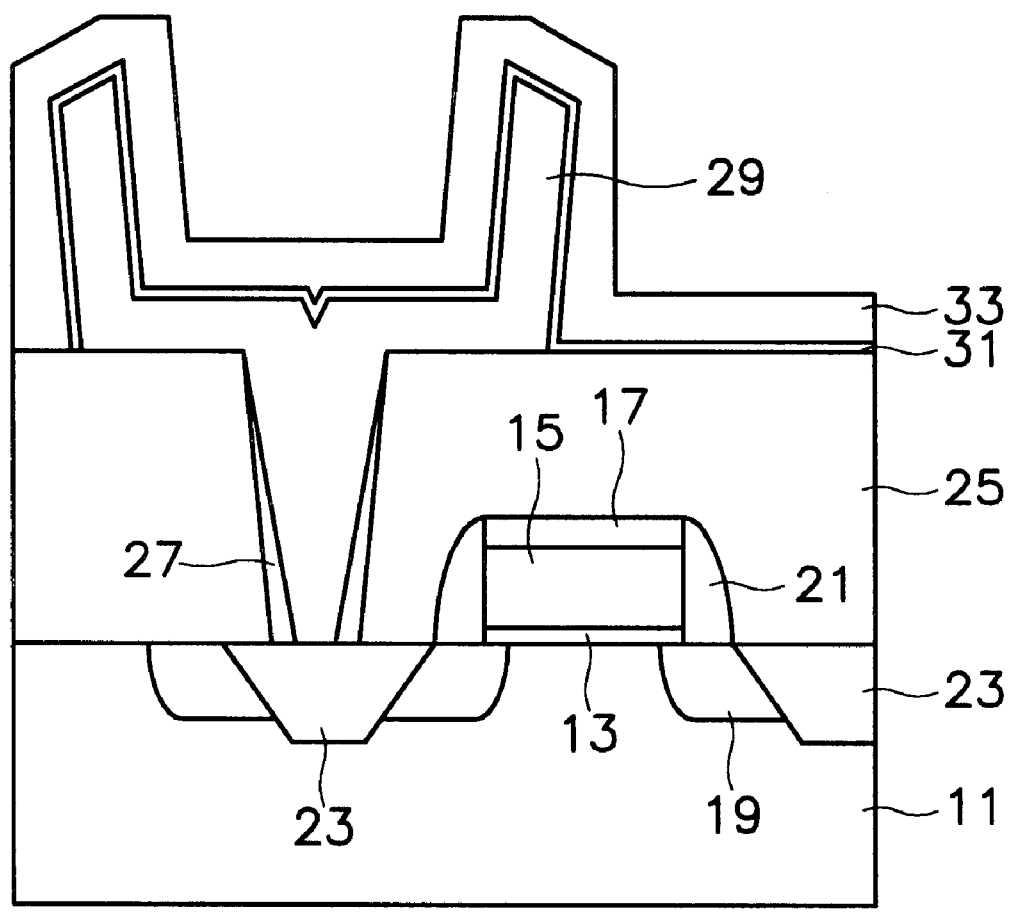
FIG. 1 is a sectional view illustrating a conventional method for fabricating a semiconductor device.
Figure 2:
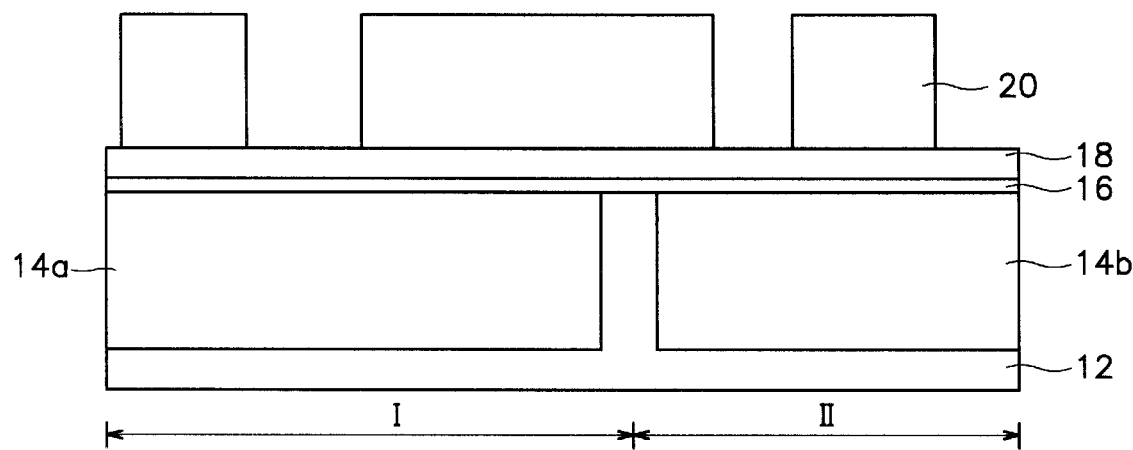
FIGS. 2 to 10 are sectional views respectively illustrating sequential steps of a method for fabricating a semiconductor device in accordance with the present invention.

In accordance with this method, a N well 14a is formed on the semiconductor substrate 12 by an ion implanting process using a N well mask (not shown) as an implant mask. An annealing process may be carried out to maintain uniformly the concentration of the N well 14a, as shown in FIG. 2.

Thereafter, a P well 14b is formed on the periphery well 14b of the semiconductor substrate 12 by an ion implanting process using a P well mask (not shown) as an implanting mask.

A pad oxide film is deposited on the semiconductor substrate 12, and a nitride film 18 is deposited on the pad oxide film 16.

Then, a first photoresist film pattern 20 is formed on the nitride film 18, thereby exposing a desired portion of the cell part for a storage electrode and a desired portion of the periphery part for an element isolating region.

Figure 3:
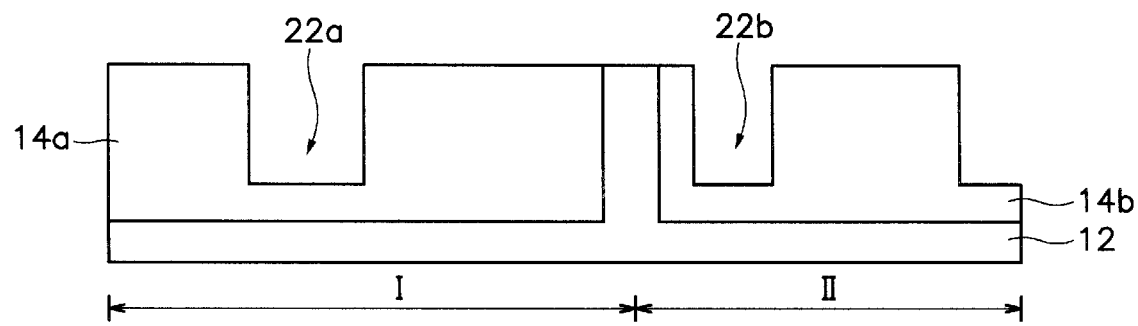

The nitride film 18, the pad oxide film 16 and semiconductor substrate 12 are removed by the first photoresist film pattern 20 using as an etching mask, thereby forming a trench 22a for a storage electrode and a trench 22b for an element isolating film as shown in FIG. 3.

Thereafter, the first photoresist film 20 and the nitride film 18 are removed. A sacrifice film (not shown) is formed on an etching surface to remove the defect which occurs on the etching surface of the trench during the process of forming the trench and then the sacrifice film is removed.

An insulating film 24, not shown, is formed over the resulting structure, thereby filling the trenches 22a and 22b.

Figure 4:
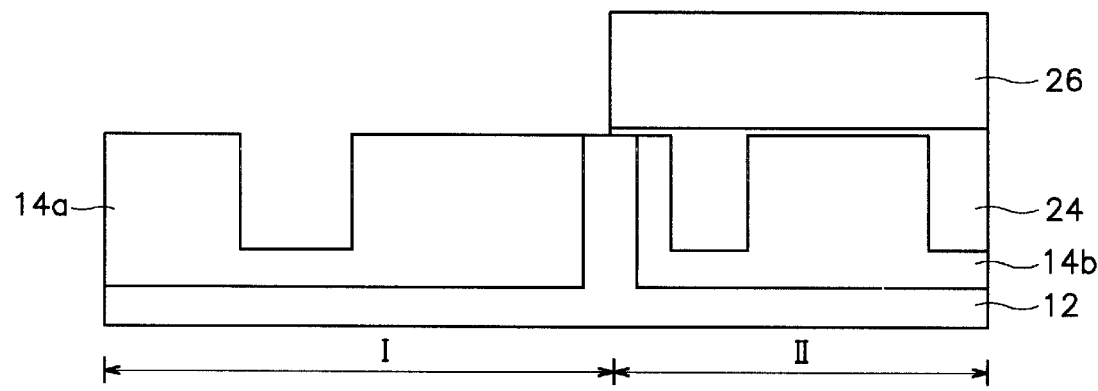

The insulating film 24 is selectively removed through a blanket etching process, thereby only remaining the trench 22a and 22b, as shown in FIG. 4.

Thereafter, a second photoresist film pattern 26 is formed on the insulating film 24 remained after the removal process thereby exposing the cell part I of the semiconductor substrate 12.

Figure 5:
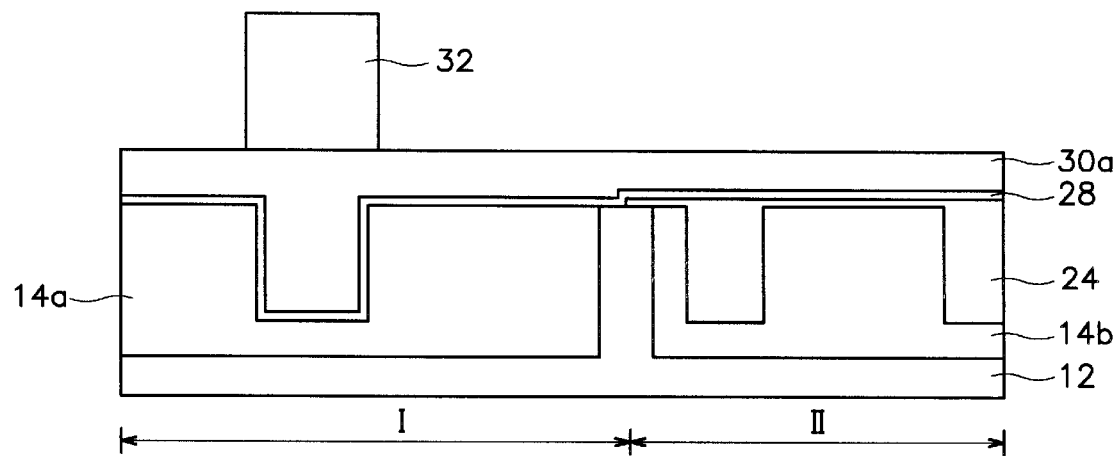

The exposed insulating film 24 is etched by the second photoresist film pattern 26 using as an etching mask, as shown in FIG. 5. The second photoresist film pattern is removed, and then a dielectric film 28 is formed over the resulting structure.

A conductive film 30a for a storage electrode is formed over the dielectric film 30a, thereby filling the trench 22a of the cell part I of semiconductor substrate 12.

Then, a third photoresist film 32 for a storage electrode mask is formed on the conductive film 30a wherein a storage electrode formed in the following process locates on the conductive film 30a.

Figure 6:
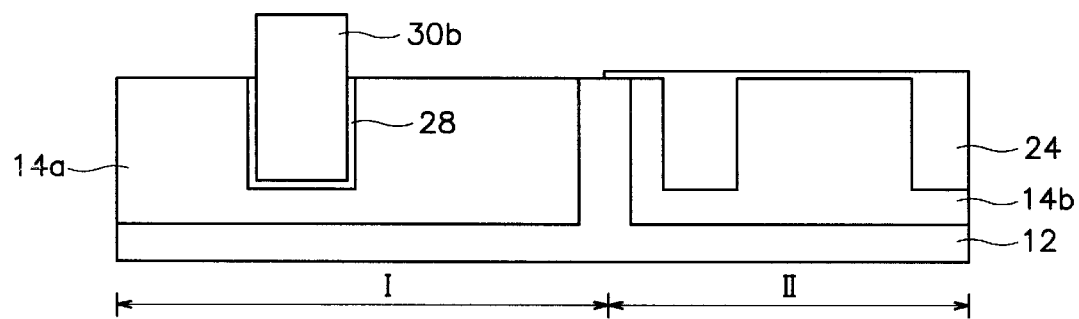

The conductive film 30a is selectively etched by the third photoresist pattern 32 for storage electrode as a mask, thereby forming a storage electrode 30b wherein the storage electrode 30b has a shape projected from the semiconductor substrate 12, as shown in FIG. 6. A N well 14a formed on the cell part I which is used as a plate electrode.

Figure 7:
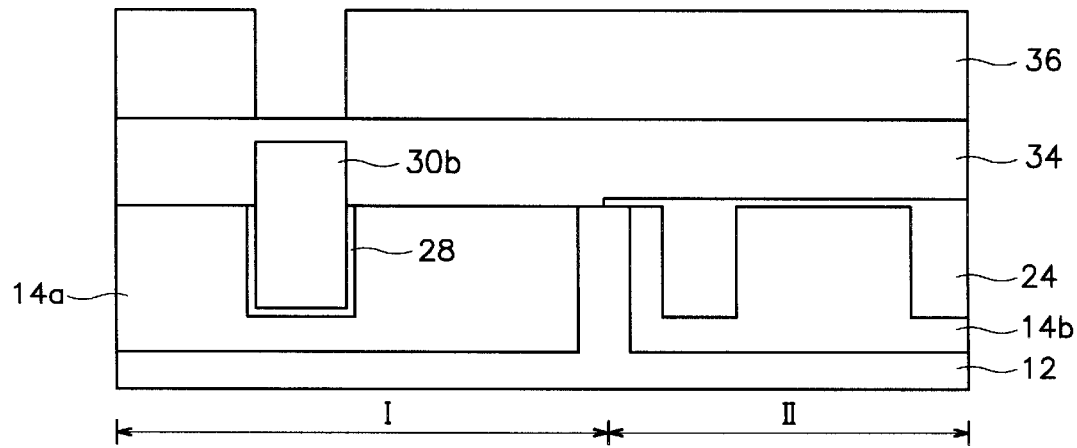

Thereafter, the third photoresist film pattern is removed, and then an intermediate layer 34 is formed over the resulting structure, as shown in FIG. 7.

A fourth photoresist film pattern 36 is formed on the intermediate layer 34, thereby exposing the storage electrode 30b.

The intermediate layer 34 is etched by the fourth photoresist film pattern 36 as an etching mask, thereby forming a contact hole (not shown) exposing the storage electrode 30b.

Figure 8:
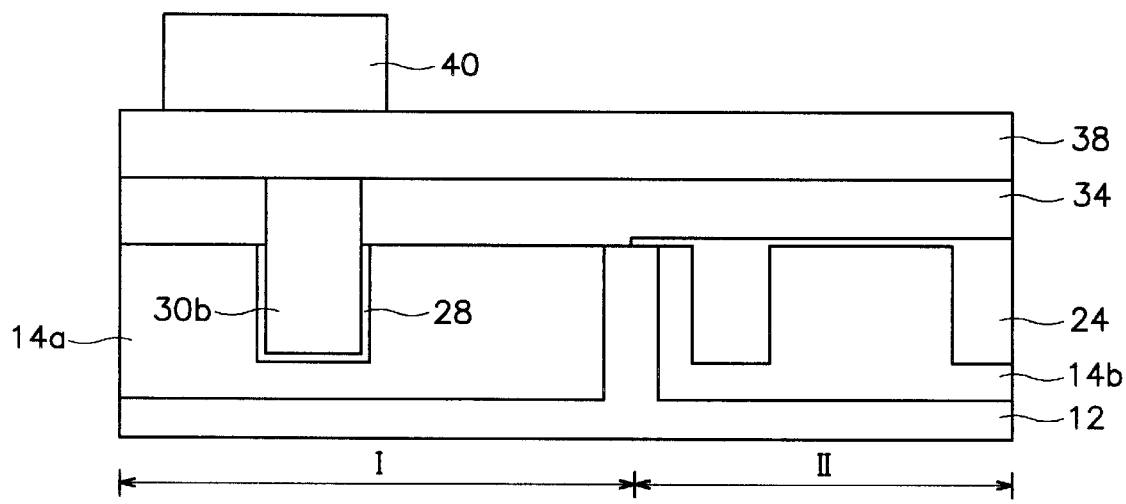

An undoped polysilicon film 38 is formed over the resulting structure, thereby connecting to the storage 30b exposed by the contact hole, as shown in FIG. 8.

Thereafter, a fifth photoresist film pattern 40 is formed over the undoped polysilicon film 38, thereby exposing a portion desired to be an active region in the cell part I.

The undoped polysilicon film 38, intermediate layer 34 and insulating film 24 of a desired thickness are sequentially etched by the fifth photoresist film pattern 40 as an etching mask. The insulating film 24 etched with the desired thickness is used as an element isolating film.

In addition, a SOI structure is a stacked structure of the undoped polysilicon film pattern formed by the etching process, the intermediate layer and the semiconductor substrate 12.

As a result, the element operation is possible under a low voltage of 1.8 V or less and the refreshed characteristic is strong due to the decrease in leakage current.

Then, the fifth photoresist film pattern is formed and then, a gate oxide film (not shown), a conductive film (not shown) for gate electrode and a mask insulating film (mask) are sequentially formed over the resulting structure.

The fifth photoresist film pattern is removed and then a gate insulating film (not shown), a conductive film (not shown) for a gate electrode and a mask insulating film (mask) are sequentially formed.

Figure 9:
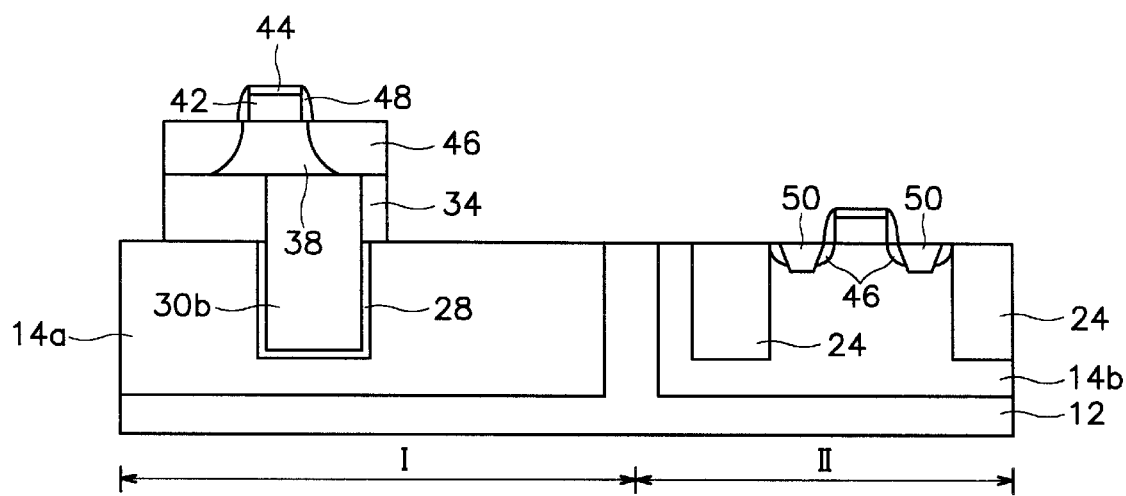

The mask insulating film, the conductive film and the gate insulating film are selectively removed by the etching process using the gate electrode mask, thereby forming gate insulating film pattern (not shown), the gate electrode 42 and mask insulating film pattern 44 over the polysilicon film pattern 38 of the cell part I and P well 14b of the periphery part II, as shown in FIG. 9.

Impurities of low density are implanted into the polysilicon film pattern 38 and the P well 14b under the sides of the gate electrodes 42, thereby forming a LDD region 46 in the polysilicon film pattern 38 and P well 14b.

Thereafter, an insulating film spacer 48 is formed on the side wall of the stacked structure of the gate electrode 42 and the mask insulating film pattern 44.

Impurities of high density are implanted into the P well 14b, thereby forming source/drain regions 50 in the P well 14b under sides of the insulating film spacer 48 disposed at the periphery part II.

Figure 10:
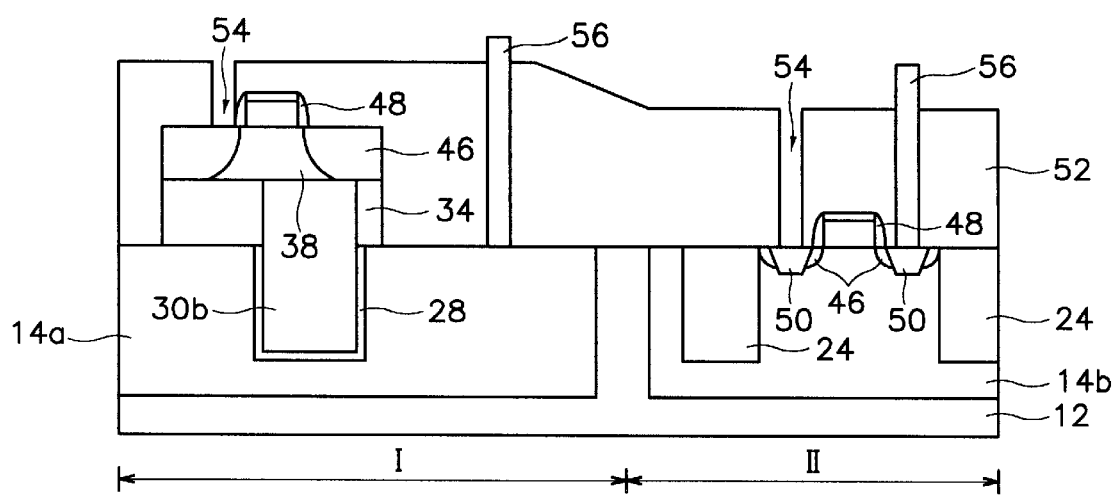

A BPSG (borophospho Silicate glass) is deposited over the resulting structure, thereby forming an intermediate insulating layer 52. Then, a flow process is carried out, thereby planarizing an entire surface of the resulting structure, as shown in FIG. 10. The intermediate insulating layer 52 functions as an element isolating film in the cell part.

The intermediate insulating film 52 is selectively removed, thereby forming a bit line contact hole 54 to be contact with the source/drain region 50 forming a bit line (not shown) at the bit line contact hole 54, and then forming a metal line 56 on the N well 14a and source/drain region 50.

A polysilicon film, tungsten silicide film or metal film is capable of forming the bit line.

In addition, for using the metal film, it simultaneously functions as the bit line of the cell part I and as the bit line and a first metal line of the periphery part II.

Thereafter, a intermediate insulating layer (not shown) having a via hole is formed over the resulting structure, thereby forming a second metal line (not shown). The second metal line functions as a first metal line in the cell part I and the second metal line in the periphery part II.

The above-metioned methods according to the present invention provide various effects.

In the method of fabrication according to the present invention, the N well is used as the plate electrode. Since a bias voltage is reversed as 0.5 Vcc, voltage is provided so that the damage of current into the semiconductor substrate of P type is small.

In addition, a cell element is formed into a type of a SOI (Silicon On Insulator) so that the device can be driven by low power. Also, a cell leakage is small so that a refreshed characteristic is improved.

A process for defining an element isolating region using a trench in the periphery part and a cap process in the cell part are simultaneously carried out so that the number of process for fabricating the device can be reduced.

In addition, a storage node is formed into the trench structure so that a step coverage between the cell part and the periphery part is reduced, and improve the characteristic of the semiconductor device.

Therefore, the method for fabricating a semiconductor device according to the present invention is capable of driving the device under the low power, and simultaneously reducing the step coverage between the cell part and periphery part and the process number of fabricating the device.

As is apparent from the above description, the present invention provides a method for fabricating a semiconductor device, capable of improving the characteristic and process yield, thereby achieving high integration of the semiconductor device.

Although the preferred embodiments of the invention have been disclosed for illustrative purposes, those skilled in the art will appreciate that various modifications, additions and substitutions are possible, without departing from the scope and the spirit of the invention as disclosed in the accompanying claims.

What is claimed is:

1. A method for fabricating a semiconductor device, comprising the steps of:
   forming a N well over a cell part of and a p well over a periphery part of a semiconductor substrate, respectively;
   etching a portion which will be a storage electrode and a portion which will be an element isolating region in the semiconductor substrate, thereby forming trenches in the N well and P well;
   forming an insulating film over the resulting structure, thereby filling the trenches;

removing the insulating film on the N well;

sequentially forming a dielectric layer and a conductive film over the resulting structure;

selectively removing the dielectric layer and the conductive film on the P well, thereby forming a dielectric layer pattern and a storage electrode and simultaneously forming an element isolating film in the trench of P well;

forming an intermediate insulating layer exposing the storage electrode over the resulting structure;

forming a polysilicon layer over the resulting structure, thereby connecting with the storage electrode;

selectively removing the intermediate layer and the polysilicon layer, thereby forming an intermediate layer pattern and a polysilicon layer pattern on the N well in the cell part; and forming a MOS transistor and a bit line over the polysilicon layer pattern of the cell part and P well of the periphery part.

2. The method in accordance with claim 1, wherein said N well is capable of being used as a plate electrode.

3. The method in accordance with claim 1, further including forming an intermediate layer over the resulting structure after the formation of the MOS transistor.

4. The method in accordance with claim 3, wherein said intermediate layer is capable of being used as an element isolating film in the cell part of the semiconductor substrate.

5. The method in accordance with claim 1, wherein said bit line is formed by any one of a polysilicon layer, a silicide layer and a metal layer.

6. The method in accordance with claim 5, wherein a step for forming a metal line in the periphery part is simultaneously carried out while the bit line is formed by the metal layer.

7. The method in accordance with claim 1, wherein said trench for the storage electrode of the cell part and said trench for the element insulation are simultaneously formed.

8. The method in accordance with claim 1, wherein said polysilicon layer comprises an undoped polysilicon layer.

9. A method for fabricating a semiconductor device, comprising the steps of:

providing a semiconductor substrate including a cell part and a periphery part;

forming a first conductive type well over the cell part of the semiconductor substrate and a second conductive type well over the periphery part of the semiconductor substrate;

etching a portion which will be a storage electrode and a portion which will be an element isolating region in the semiconductor substrate to form trenches;

forming an insulating film over the resulting structure, thereby filling the trenches in the cell part and the periphery part;

removing the insulating film in the trench of the first conductive well;

sequentially forming a dielectric layer and a conductive layer over the resulting structure;

forming a first photoresist film pattern for a storage electrode mask over said conductive layer on the cell part;

selectively removing the conductive layer and the dielectric layer using the first photoresist film pattern as a mask to form a storage electrode and a dielectric layer pattern and simultaneously forming an element isolating film in the trench of the periphery part;

removing the first photoresist film pattern and forming an intermediate insulating layer with a contact hole exposing the storage electrode over the resulting structure;

forming an undoped polysilicon layer over the resulting structure, thereby connecting with the storage electrode through the contact hole;

forming a second photoresist film pattern over a portion which will be an active region of the undoped polysilicon layer;

removing the undoped polysilicon layer and the intermediate insulating layer by the second photoresist film pattern as a mask to form a polysilicon layer pattern and an intermediate insulating layer pattern;

removing the second photoresist film pattern; and forming a MOS transistor and a bit line over the polysilicon layer pattern of the cell part and the periphery part.

10. The method in accordance with claim 9, wherein said first conductive type well is capable of being used as a plate electrode.

11. The method in accordance with claim 9, further including forming an intermediate layer over the resulting structure after the formation of the MOS transistor.

12. The method in accordance with claim 11, wherein said intermediate layer is capable of being used as an element isolating film in the cell part of the semiconductor substrate.

13. The method in accordance with claim 9, wherein said bit line is formed by any one of a polysilicon layer, a silicide layer and a metal layer.

14. The method in accordance with claim 13, wherein a step for forming a metal line in the periphery part is simultaneously carried out while the bit line is formed by the metal layer.

15. The method in accordance with claim 9, wherein said trench for the storage electrode of the cell part and said trench for the element insulation are simultaneously formed.

* * * * *